(12) United States Patent
Buschbeck et al.

(10) Patent No.: US 6,185,124 B1
(45) Date of Patent: Feb. 6, 2001

(54) STORAGE CIRCUIT APPARATUS

(75) Inventors: Steffen Buschbeck, Dresden; Heiko Roeper, Radeberg; Thomas Wolf, Dresden, all of (DE)

(73) Assignee: Zentrum Mikroelektronik Dresden GmbH, Dresden (DE)

(*) Notice: Under 35 U.S.C. 154(b), the term of this patent shall be extended for 0 days.

(21) Appl. No.: 09/306,306

(22) Filed: May 6, 1999

(30) Foreign Application Priority Data

Oct. 14, 1998 (DE) .............................................. 198 47 175

(51) Int. Cl.$^7$ ................................................. G11C 11/24
(52) U.S. Cl. ................ 365/149; 365/229; 365/185.08; 365/51
(58) Field of Search ................................. 365/149, 229, 365/226, 51, 52, 185.08

(56) References Cited

U.S. PATENT DOCUMENTS

| | | | |
|---|---|---|---|
| 5,519,663 | 5/1996 | Harper, Jr. et al. | 365/229 |
| 6,018,802 | 1/2000 | Abe et al. | 365/229 |

FOREIGN PATENT DOCUMENTS

| | | |
|---|---|---|
| 1293555 | 11/1989 | (JP). |
| 1318259 | 12/1989 | (JP). |
| 2202049 | 8/1990 | (JP). |
| 2307255 | 12/1990 | (JP). |
| 3123068 | 5/1991 | (JP). |
| 521698 | 1/1993 | (JP). |
| 5136329 | 6/1993 | (JP). |
| 8046133 | 2/1996 | (JP). |
| 9199666 | 7/1997 | (JP). |

Primary Examiner—Huan Hoang
(74) Attorney, Agent, or Firm—Baker Botts L.L.P.

(57) ABSTRACT

A storage circuit apparatus includes a support material, a semiconductor chip on which at least one shadow RAM is integrated, a capacitor element and a circuit housing. The storage circuit shadow RAM apparatus is able to perform a STORE operation to secure the RAM content in the non-volatile shadow memory practically independently of the time curve in "power down," without external accessory circuitry. The capacitor element, consisting at least of electrodes and dielectric, is integrated in the circuit housing, and furnishes the energy required for the STORE operation in power-down.

6 Claims, 3 Drawing Sheets

STORAGE CIRCUIT APPARATUS

FIELD OF THE INVENTION

The present invention generally relates to a storage circuit apparatus, and more particularly relates to integrated circuit memory consisting of a support material, upon which a semiconductor chip having at least one "shadow RAM" is integrated along with a capacitance furnishing the energy required for a STORE operation in the event of a "power down" condition.

BACKGROUND OF THE INVENTION

In principle, it is known that in semiconductor circuits, IC support strips with outside connections may be provided with a semiconductor chip and a housing consisting of a casting compound. The connection between the IC support strip and semiconductor chip is made by means of "bond" wires or other conductor materials.

Semiconductor memories represent a large sector among semiconductor circuits. They are classified in numerous different types, of which examples are given below.

In an electrically erasable programmable read only memory (EEPROM), an IC support strip e.q., lead frame, is provided with outside connections to an EEPROM chip and the assembly is encased in a housing consisting of a casting compound. This structure corresponds to the basic structure of semiconductor circuits. With EEPROMs, non-volatile storage of data and an unlimited number of read cycles are possible. There are disadvantages in that the number of write cycles is limited and the writing speed is generally slow.

In the case of static random access memory (SRAMs) the structure corresponds to the general structure of semiconductor circuits. An SRAM generally includes an IC lead frame for providing outside connections, an SRAM chip and a housing. With SRAMs, an unlimited number of write and read cycles are possible, and substantially higher access speed for reading and writing than with EEPROMs. However, only volatile data storage is possible, which means that the data is preserved only while operating voltage is applied; in the "power down" case, the stored data is lost.

To avoid the disadvantage of volatile data storage in SRAM, methods are employed for supplying alternative voltage to the SRAM when the system supply voltage is cut off. One such method is battery-supported "backup," utilized for example in Bat SRAMs.

A Bat SRAM consists of a "board" with an SRAM and a voltage detector IC mounted thereon, or SRAM with integrated voltage detector therein. Contact strips are mounted on the board. These serve for connecting the Bat SRAM to other devices. Spacing and arrangement of the contacts are the same as for conventional "dual in line" plastic housings. A battery is arranged on the board as well. The entire apparatus is surrounded by a housing, and is filled with a casting compound.

The battery integrated in the component provides the voltage supply for the purpose of preserving data in the SRAM chip in the absence of external voltage supply.

Bat SRAMs exhibit generally higher access speeds compared to EEPROMs and an unlimited number of write cycles. To be sure, high production costs and reduced dependability, owing to the large number of components and connections used, are disadvantageous. Other disadvantages to be noted are high assembly outlay in production, a limited range of service and storage temperature due to the battery, and a limitation of the useful life of the component by limited battery lifetime, typically for example ten years. Also, possibilities of miniaturization and use as a surface mount device (SMD) component are limited.

A further development of Bat SRAMs are Bat SRAMS in the SMD housing with plug-in battery capsules. These correspond to the basic structure of semiconductor circuits. The IC support strips with outside connections are provided with an SRAM chip having integrated voltage detector and housing. Additionally, plug or spring contacts are worked into the housing, enabling the electrical connection between the battery capsule and the IC proper. Thus, properties of conventional Bat SRAMs, in particular with a view to production of SMD components, are improved. Besides, the plug-in battery module permits replacement of the battery in the soldered in condition of the component.

Of course, a high assembly outlay in production and reduced dependability due to the numerous components and connections used constitute disadvantages. Besides, dependability is limited by non-hermetically-sealed capsuling of the electrical connection between battery capsule and SRAM-IC. Also, a limited range of service and storage temperatures due to the battery and additional maintenance outlay due to replacement cycles of the battery capsule should be mentioned.

A combination of the properties of volatile RAMs, c.g. SRAM or Dynamic Random Access Memory (DRAM), offering the advantage of fast memory access for reading and writing and an unlimited number of write and read cycles, and non-volatile memories, e.g. EEPROMs, ferroelectric RAMs, magnetoresistive RAMs, offering the advantage of data conservation even with supply voltage shut off, is found in non-volatile "shadow" RAMs.

A modification of these shadow RAMs are shadow SRAMs, in which a storage configuration of volatile SRAM and nonvolatile EEPROM is integrated. Compared to Bat SRAMs, shadow SRAMs are distinguished for example by considerably simpler design structure, smaller dimensions, greater dependability and useful life, wider range of service and storage temperature, and higher access speed.

This quality is achieved by a circuit apparatus integrated on the semiconductor chip, which, besides the SRAM region proper, contains an additional EEPROM matrix and a complex control logic.

Shadow SRAMs are predominantly fabricated in standard IC housings; the design structure corresponds to the structure of SRAMs or EEPROMs.

The shadow SRAM is operated like an ordinary SRAM; some types are "pin"-compatible with standard SRAMs or Bat SRAMs. Write and read accesses take place in the SRAM region with access speeds comparable to that of standard SRAMs. The SRAM region may be read and inscribed any number of times.

The SRAM region of the shadow SRAM is connected bitwise to the EEPROM matrix. In the integrated EEPROM, a hardware or software signal, within a few milliseconds, accomplishes lasting security of the information stored in the SRAM (STORE) or a reloading of the EEPROM content into the SRAM (RECALL). When service voltage is switched on, the information stored in the EEPROM is loaded into the SRAM.

Optionally, shadow SRAM types are available which automatically secure the SRAM content in the EEPROM in event of voltage interruptions. Such devices are called "PowerStore" devices. The PowerStore type contains an integrated voltage monitor that automatically triggers a STORE operation upon decline of the service voltage below a defined minimum ($V_{switch}$)

The energy required for PowerStore is furnished, for example, by a support capacitor connected by way of an additionally circuited "pin." By the connection of the external capacitor to this so-called $V_{cap}$ pin, a shadow SRAM voltage supply independent of the declining system energy (power down) is secured, so that the process of data securement can be concluded independently of the time curve of the power-down.

In some applications, the use of a shadow SRAM with standard "SRAM pin layout" is required. This relates for example to pre-existing circuits in which it is desired to replace a standard SRAM or Bat SRAM hitherto used with a shadow SRAM without requiring changes in circuit layout.

There are also known shadow SRAM types that are compatible with standard SRAMs both in structure and in "pin out." These types consist of a shadow SRAM chip fastened to a lead frame and cast in a standard SRAM housing. On the basis of the compatibility required, in these types of devices, the additional connection of a condenser to the IC to furnish the energy supply for power-down is not feasible.

In these types, therefore, the energy required for PowerStore is furnished by the residual energy remaining in the system. Here, requirements must be observed regarding the power down voltage drop in the system. Thus the further voltage drop from $V_{switch}$ on to a defined minimum must exceed a defined minimum time difference.

In applications with too little system energy after cut-off of the voltage supply, a voltage drop faster than allowed for this type of device may occur, so that this fixed minimum time difference is not available.

In these applications, therefore, a shadow SRAM with standard SRAM pin-out and no additional circuiting is required, yet which, even with fast power-down, is capable of carrying out a dependable STORE operation. Such a device would exhibit the two advantages of the shadow SRAM types.

In Applicant's technical documents, a modular apparatus is described that at least partly avails itself of a standard SRAM pin-out. This modular apparatus consists of several shadow SRAM ICs connected to an external capacitor on the module furnishing the energy required for the STORE operation. Besides, the circuit arrangement of the module contains a decoder IC as well as several capacitors for high frequency interference suppression.

The known components are mounted on a common conductor plate provided with two plug or "gullwing" contact rows for contacting on "system boards." These contact rows are arranged such that they match a standard DIP or SOP grid in their pin-out.

So far as technically feasible, the contact occupancy is arranged with regard to a standard SRAM pin-out.

SUMMARY OF THE INVENTION

An object of the invention, then, is to specify an arrangement for shadow RAMs that, with no external accessory circuitry, realizes the desired miniaturization and can perform a STORE operation to secure the RAM content in the non-volatile shadow memory independently of the time curve in power-down.

This object is accomplished in that the capacitance takes the form of a capacitor element consisting at least of electrodes and dielectric, and a semiconductor chip and the capacitor element are mechanically fixed in a common housing on a support strip, and are electrically connected by bond wires, conductor strips, soldering, welding and/or conductive adhesive connections to the lead frame and/or each other.

This apparatus permits a SRAM-pin compatible embodiment of a shadow SRAM capable of performing a STORE operation to secure the storage data of the volatile SRAM in an EEPROM practically independently of the power-down time curve, without external accessory circuitry.

In practically all sectors of the electronics industry, there is a consistent trend to miniaturization. This trend necessitates a more far-reaching reduction of outside dimensions of the entire circuit apparatus. To accommodate the small volume of such housings, tantalum chip capacitors, which are distinguished by an especially high capacitance per unit volume are generally employed. Commonly, such tantalum chip capacitors have a porous tantalum sinter with a tantalum oxide surface and a multi-layer coating, e.g. of manganese oxide, graphite and silver. The core of the tantalum member is formed by a web of tantalum passing out of the sinter.

However, it is also possible to integrate the capacitor element without a housing of its own. The entire apparatus is here cast in a housing whose dimensions for example match a standard RAM housing. Then the storage of the energy required for the STORE operation in power down is taken over by the apparatus of electrodes and dielectric with a capacitor function without housing, instead of by a standard capacitor.

The housing of the integrated circuit apparatus here assumes the additional function of a capacitor housing, serving for example to provide a hermetic seal, protection from outside influences, mechanical fastening of the capacitor, electrical contacting on boards, and identification.

In this way, an apparatus for storing the energy required for the STORE operation that, by contrast to the use of capacitors in standard housings, is distinguished by a substantially smaller space requirement, thus meeting the demand for further miniaturization. Furthermore, by the use of the circuit housing to encapsulate the capacitor element, a reduction of manufacturing costs and an enhancement of dependability are achieved by reducing the number of electrical connections.

In another embodiment of the invention, provisions are made for the capacitors element to have a housing of its own. This has the advantage that standard capacitors can be employed.

To achieve a hermetic seal, for protection from outside influences, for mechanical fixation, for electrical contacting on boards and for identification, the coded tantalum member is enveloped in its own housing. This housing consists of a cast material in which conductor tracts leading to the outside are embedded, being configured on the outside as contact surfaces for SMD assembly. In the interior of the condenser housing, these conductor tracts are electroconductively connected by soldering, welding or bonding connections to the tantalum web and the silver coating on the tantalum member.

In a further modification of the invention, provisions are made for the entire apparatus to be cast in a standard housing, mechanically and/or pin-wise compatible with standard storage circuits.

Here the outgoing parts of the lead frame of the integrated circuit apparatus, configured as pins as in standard housings, can be so connected to the chip and to the capacitor element that a standard RAM-compatible pin configuration is achieved.

Thus, for example a standardized SRAM pin equipment can be offered, a further miniaturization of the component carried out, for example by use of small outline packaging (SOP) and TSOP housings, and at the same time the advantageous power-down data storage can be realized all the same, without requiring additional outside circuitry to accomplish this.

Thus it becomes possible to employ the integrated storage circuit apparatus according to the invention, mechanically as well, instead of a conventional standard RAM.

In another embodiment, the capacitor element is fixed directly to the semiconductor chip and electrically connected to it and/or to the lead frame by bond wires, conductor strips, soldered, welded and/or adhesive conductor connections.

Yet another embodiment of the integrated circuit apparatus provides that the outer surface of the capacitor element is wholly or partially fashioned as a contact surface, and at least one conductive area is formed on the chip surface, connected to the inner circuit of the chip. In this embodiment, the capacitor element is electro conductively bonded to this region of the chip surface, so that at least one of the connections between chip and condenser can be replaced in this way.

Another modification of the integrated circuit apparatus provides that the semiconductor chip and the capacitor element are fixed side-by-side on the lead frame and are electrically connected to the lead frame and/or each other by bond wires, conductor strips, soldered, welded and/or adhesive conductor connections.

BRIEF DESCRIPTION OF THE DRAWINGS

The invention will be illustrated in more detail below in terms of an embodiment by way of example. In the corresponding drawings.

Figure 1:
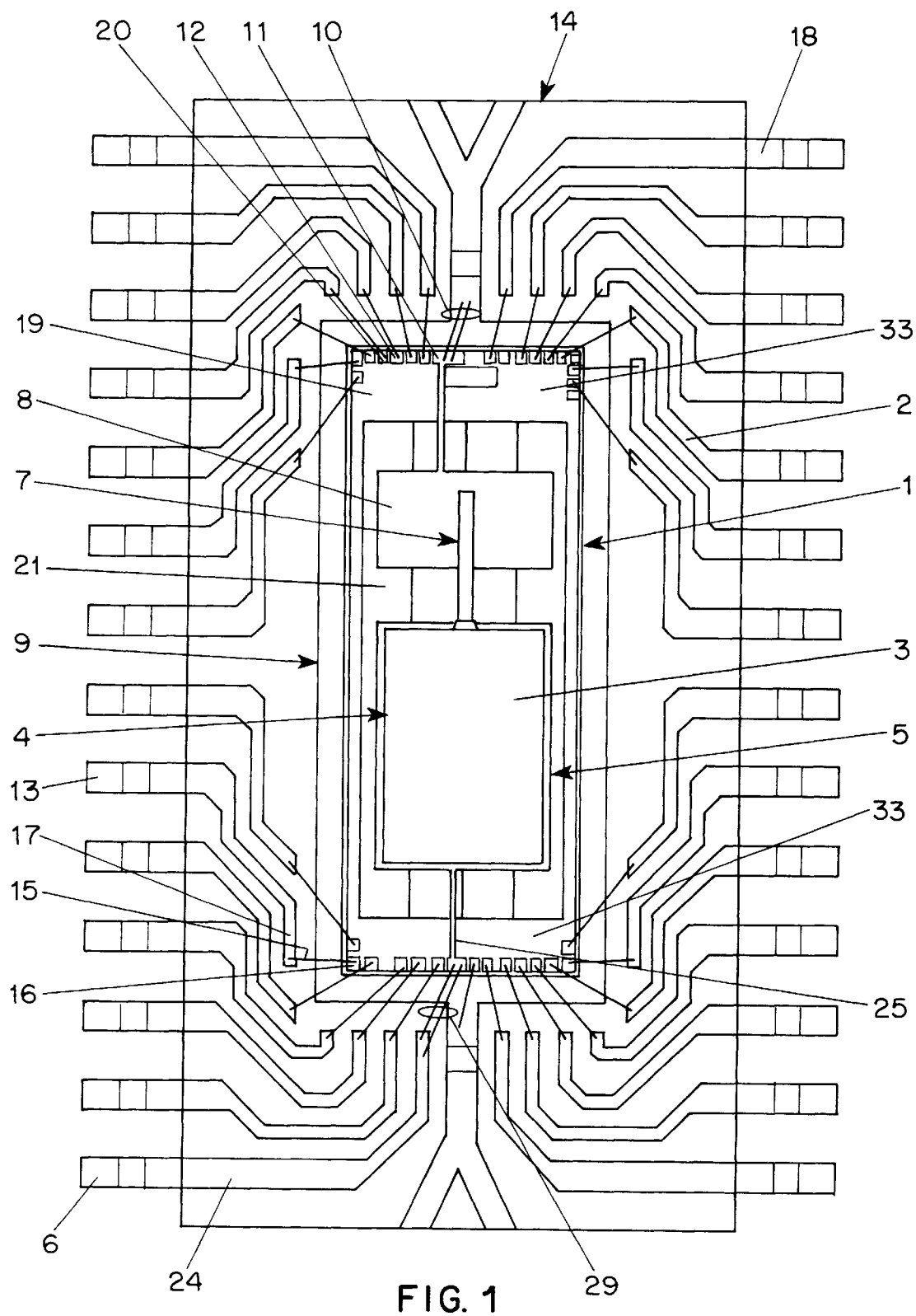
FIG. 1 shows a view of a first embodiment of the storage apparatus according to the invention.

Throughout the figures, the same reference numerals and characters, unless otherwise stated, are used to denote like features, elements, components or portions of the illustrated embodiments. Moreover, while the subject invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

In a first embodiment, as shown in particular in FIG. 1, a shadow SRAM chip 1 is fixed to the lead frame 2 by an adhesive connection. On the surface of the shadow SRAM chip 1, there is an electrical contact area 5 formed by a metallized area on the chip 1. This contact area 5 is electroconductively connected inside of the chip 1 to the $V_{ss}$ bond island 25 of the shadow SRAM chip 1. On the contact area 5, the condenser element 3 is fixed by an electro conductive adhesive connection.

To ensure the storage capacity required for the STORE operation, a tantalum capacitor clement is employed. The capacitor element 3 has a tantalum body not shown in detail. One of the electrodes, likewise not shown in detail, of the capacitor element 3 is formed by a multi-layer suffice on the tantalum member, whose outer coating 4 consists of silver. This silver coating 4 is connected directly to the adhesive conductor connection on the contact surface 5 of the chip and hence to the $V_{ss}$ bond island 25. The $V_{ss}$ bond island 25 in turn is so connected via bond wires 29 to the lead frame 2 that an electroconductive connection is made to the outgoing mass pin, i.e. the $V_{ss}$ pin 6, by way of the conductor strip 24 of the lead frame 2.

At one of the end faces of the capacitor element 3, a tantalum web 7 passes out, integral with the tantalum body of the capacitor element 3. The tantalum web 7, by way of an adhesive connection 27, establishes an electroconductive connection with another contact area 8 on the chip surface. This contact area 8 is electro conductively connected inside of the chip 1 to the $V_{cap}$ bond island 11 of the shadow SRAM chip 1.

The other connections of the shadow SRAM chip 1 to the pins 13 of the housing 14 of the semiconductor apparatus are produced by bond wires 13 between the corresponding bond islands 16 and the tabs 17 of the lead frame 2. This is done so that the configuration of the address, data and control pins answers to the standard SRAM pin coordination.

In addition to the aforementioned advantages of this form of embodiment, this arrangement in many cases provides the possibility of using a standard lead frame as lead frame 2, for example from standard SRAMs, so that a further reduction of manufacturing cost is made possible by reduction of set-up costs.

The voltage supply of the shadow SRAM chip 1 takes place in normal operation from the system supply voltage, not represented in detail, by way of the $V_{cc}$ supply voltage pin 18 connected to the $V_{cc}$ bond island 12.

On the shadow SRAM chip 1, besides the SRAM/EEPROM storage matrix 21, a storage logic 33 and a STORE/RECALL control 19 are integrated. The storage access takes place on the SRAM region of the integrated storage matrix 21.

The internal chip STORE/RECALL control 13 performs essentially a constant surveillance of the applied supply voltage, so as to be able to automatically perform a non-volatile safety of the volatile SRAM data when certain voltage thresholds are reached. The STORE/RECALL controls 19, in normal operation, ensure by way of a controlled chip-internal transistor 20 that the chip-internal components are supplied with voltage and the capacitor element 3 is charged.

In power-down, on downward transgression of a defined voltage $V_{switch}$ the connection to the $V_{cc}$ supply voltage pin 18 is broken. The further voltage supply of the shadow SRAM chip 1 takes place independently of the external supply voltage from the energy stored in the capacitor element 3, used particularly for safe storage of SRAM data in the chip-internal EEPROM region. This ensures that independently of the further course of decline of the external supply voltage $V_{cc}$ in power-down, an adequately high internal supply voltage will be available.

Figure 2:
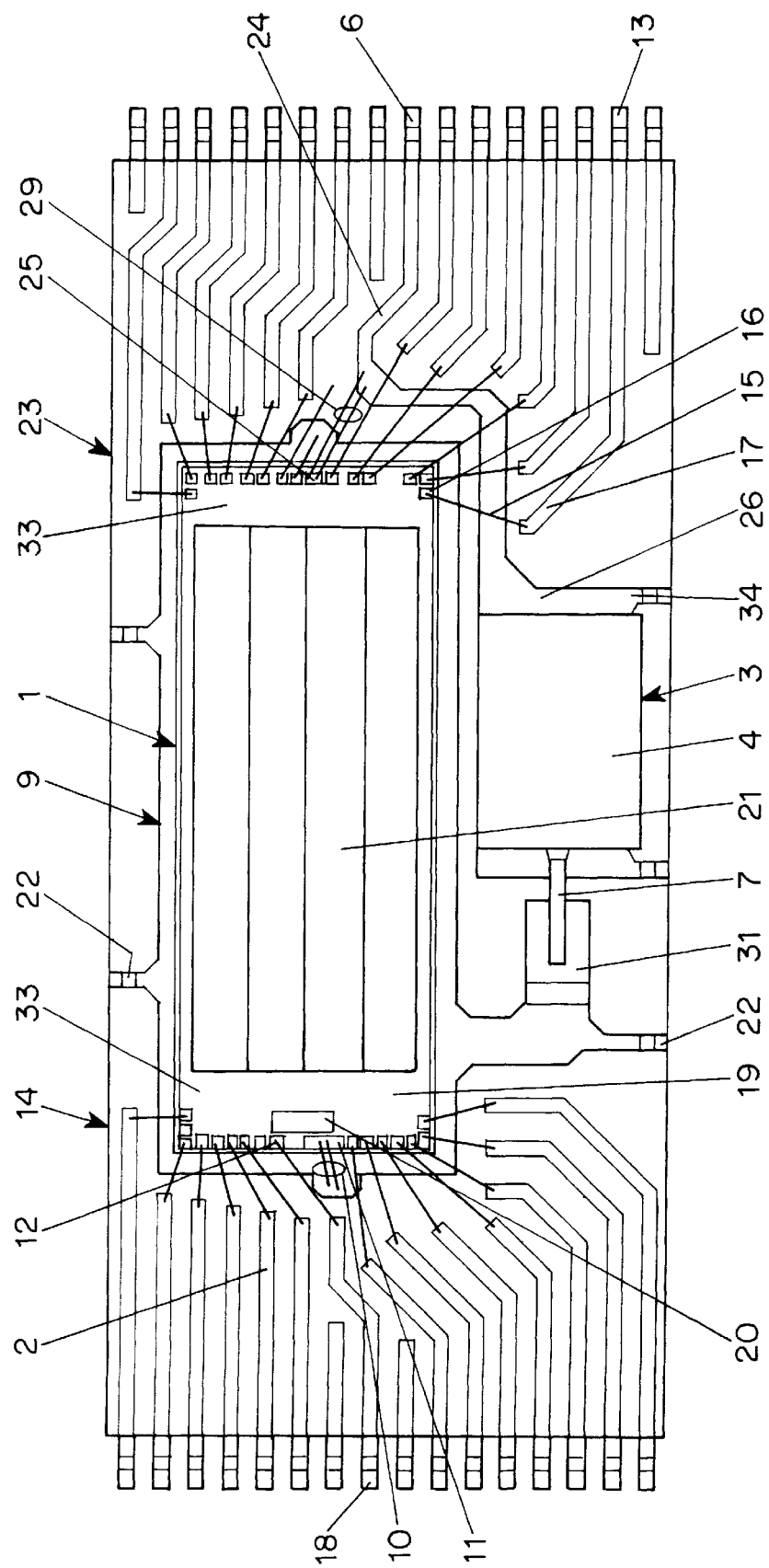
FIG. 2 shows a second embodiment of the storage apparatus according to the invention.
Figure 3:
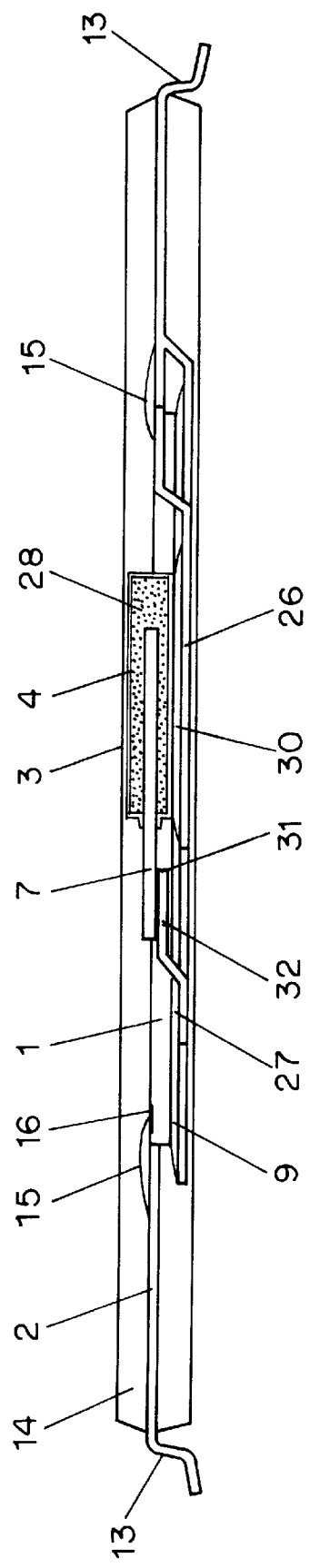
FIG. 3 shows a section through the storage apparatus according to the invention in the second embodiment thereof.

In the second embodiment, as shown in particular in FIGS. 2 and 3, the shadow SRAM chip 1 is fixed by an adhesive connection 27 to the central island 9 of the lead frame 2 and connected between the bond islands 16 and tines 17 by bond wires 15 to the lead frame 2, thereby establishing an electrical connection to the outgoing pins 13 of the housing 14 of the integrated circuit apparatus. In addition to the connections to the outgoing pins 13, there is a bond connection 10 from the $V_{cap}$ bond island 11 of the shadow SRAM chip 1 to the center island 9 of the lead frame 2, on which the shadow SRAM chip 1 is mounted.

The center island 9 is connected to webs 22 terminating at the long sides 23 of the housing 14 of the circuit apparatus, with no provision for a connection to the outside. Such webs 22 are employed in particular for mechanical fixation of the center island 9 during the enveloping process in circuit "packaging."

The conductor strip 24 of the lead frame 2, connecting the $V_{ss}$ pin 6 to the $V_{ss}$ bond island 25 of the shadow SRAM chip 1 is so configured that it has an enlargement serving as mounting area 26 to which the tantalum capacitor element 3 is fixed by an electrically conductive adhesive connection 30. This mounting area 26 is located immediately beside one of the webs 22 connected to the center island 9 and has two webs 34.

The $V_{ss}$ bond island 25 is connected by bond wires 29 to the conductor strips 24. There is no direct connection between the center island 9 and the mounting area 26.

As in the preceding embodiment by way of example, one of the electrodes of the capacitor element 3 is formed by a multi-layer circuit on the tantalum member, whose outer coating 4 consists of silver. This silver coating 4 is connected by the electro conductive adhesive connection 30 to the mounting surface 26 of the conductor strip 24 and hence to the outgoing $V_{ss}$ pin 6 and the $V_{ss}$ bond island 25 of the shadow SRAM chip 1.

At one end face of the capacitor element 3, a tantalum web 7 is extends outwardly the tantalum web 7 is integral with the tantalum member 28 of the capacitor element 3.

The construction of the lead frame 2 and the arrangement of the capacitor element 3 are such that the end of the tantalum web 7 is located over a lateral extension 31 of one of the webs 22 of the lead frame 2, connected to the center island 9 and hence to the $V_{cap}$ bond island 11 of the shadow S RAM chip 1.

Further, the conductor strip 24 to which the capacitor element 3 is bonded is lowered at the mounting suspense 26 so that the capacitor element 3 is arranged centrally between top and bottom of the housing 14. To equalize the difference in height between tantalum web 7 and web 22, the extension 31 is offset upwardly from mounting surface 26 so that the tantalum web 7 rests 3 directly on the extension 31 of the web 22 of the lead frame 2, connected to the center island 9. The electrical and mechanical connection between tantalum web 7 and the extension 31 of the web 22 is preferably produced by an electro conductive adhesive connection 32.

By virtue of the especially flat structural form of this apparatus, it is especially suitable for housings of low height such as SOP and TSOP, which are already in widespread use for semiconductor memories.

The electrical function of the circuit apparatus is as described for the first embodiment.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A memory storage circuit comprising:
   a support material, said support material including a lead frame;
   a semiconductor chip on which at least one shadow RAM is integrated; and
   a capacitor element arranged to furnish energy required for a STORE operation in said shadow RAM in response to a "power down" condition, said capacitor element having electrodes and dielectric, said semiconductor chip being mechanically and electrically coupled to said lead frame and said capacitor element being mechanically and electrically coupled to at least one of said lead frame and said semiconductor chip.

2. The storage circuit apparatus according to claim 1, wherein the capacitor element has a housing of its own.

3. The storage circuit apparatus according to claim 1, wherein the apparatus is cast in a housing compatible with standard storage circuits.

4. The storage circuit apparatus according to claim 1, wherein the capacitor clement is mechanically affixed directly to the semiconductor chip and is electrically connected thereto.

5. The storage circuit apparatus according to claim 1, wherein at least a portion of an outer circuit of the capacitor element is a contact surface, and said semiconductor chip includes at least one conductive region which is connected to an internal circuit of the chip, and said capacitor element is electro conductively bonded to the conductive region of the chip surface.

6. The storage circuit apparatus according to claim 1, wherein said semiconductor chip and said capacitor element are fixed side-by-side on said lead frame and are electrically connected to the lead frame and each other.

\* \* \* \* \*